United States Patent [19]

Ekdahl

[11] Patent Number: 4,596,967
[45] Date of Patent: Jun. 24, 1986

[54] HIGH POWER MICROWAVE GENERATOR

[75] Inventor: Carl A. Ekdahl, Albuquerque, N. Mex.

[73] Assignee: The United States of America as represented by the United States Department of Energy, Washington, D.C.

[21] Appl. No.: 566,761

[22] Filed: Dec. 29, 1983

[51] Int. Cl.$^4$ .............................................. H03B 9/08
[52] U.S. Cl. ...................................... 331/82; 331/79; 315/5.34
[58] Field of Search ........................... 331/79, 81, 82; 315/3.5, 5, 5.34, 5.35, 39, 39.3

[56] References Cited

U.S. PATENT DOCUMENTS

| | | | |
|---|---|---|---|
| 2,634,372 | 4/1953 | Salisbury | 315/1 |
| 2,866,917 | 12/1958 | Salisbury | 315/4 |
| 4,225,806 | 9/1980 | Lé Gardeur | 315/5 |
| 4,345,220 | 8/1982 | Sullivan | 331/79 |

OTHER PUBLICATIONS

S. J. Smith and E. M. Purcell, "Visible Light from Localized Surface Charges Moving Across a Grating", Phys. Rev. 92, 1069 (1953).

John A. Bradshaw, "A Millimeter Wave Multiplier Using the Purcell Radiator", Proc. Symp. on Millimeter Waves, Polytechnic Press, NY, 223-231 (1960).

K. Ishiguro and T. Tako, "An Estimation of Smith-Purcell Effect as the Light Source in the Infra-Red Region", Optica Acta 8, 25-31 (1961).

Primary Examiner—Eugene R. LaRoche
Assistant Examiner—Robert J. Pascal
Attorney, Agent, or Firm—Samuel M. Freund; Paul D. Gaetjens; Judson R. Hightower

[57] ABSTRACT

A microwave generator efficiently converts the energy of an intense relativistic electron beam (REB) into a high-power microwave emission using the Smith-Purcell effect which is related to Cerenkov radiation. Feedback for efficient beam bunching and high gain is obtained by placing a cylindrical Smith-Purcell transmission grating on the axis of a toroidal resonator. High efficiency results from the use of a thin cold annular highly-magnetized REB that is closely coupled to the resonant structure.

6 Claims, 11 Drawing Figures

HIGH POWER MICROWAVE GENERATOR

This invention is the result of a contract with the Department of Energy (Contract No. W-7405-ENG-36).

BACKGROUND OF THE INVENTION

The present invention pertains generally to microwave generators and more particularly to microwave generators for converting the energy of an intense relativistic beam (REB) into a high-powered microwave emission.

The present invention utilizes the Smith-Purcell effect, see S. J. Smith and E. M. Purcell, Phys. Rev. 92, 1069 (1953) and G. Toraldo di Francia, Nuovo Cimento 16, 61 (1960). The Smith-Purcell effect is related to Cerenkov radiation, see I. M. Frank and I. Tamm, Dokl. Akad. Nauk. 14, 109 (1937) and J. V. Jelley, Cerenkov Radiation and its Applications, (Pergamon Press, NY, 1958).

Early efforts in this field have demonstrated the feasibility of generating high frequency radiation by passing a beam between the standing wave pattern formed by a grating and a reflector, see U.S. Pat. Nos. 2,634,372 and 2,866,917 issued to W. W. Salisbury. A row of hemispheres have been embedded in a plane as a Smith-Purcell radiator, again in the reflection mode rather than the transmission, see J. A. Bradshaw, Proc. Symp. on Millimeter Waves (Polytechnic Press, NY 1960), p. 223. Also, experiments have been performed that produced infrared radiation using reflection gratings and non-relativistic beams, see K. Ishiguro and T. Tako, Optica Acta 8, 25 (1961).

However, none of the above teaches the coupling of a magnetized relativistic electron beam (REB) excited transmission to a resonator as in the present invention to form an efficient generator or amplifier of frequency stable microwaves. Further, none of the above teaches the use of the radiation at 90° to achieve superior frequency stability.

The present invention satisfies the need for a high-power, monochromatic microwave source for laboratory experiments with microwave-impulse air breakdown at 35 GHz and below. This power requirement suggests the use of a pulse-power REB excited microwave tube. However, for most pulse-power REBs, the beam energy continuously varies during the pulse, and the microwave output frequency would not be monochromatic, but swept, if it were strongly dependent on the beam energy. The present invention circumvents this annoyance.

SUMMARY OF THE INVENTION

Therefore it is an object of the present invention to provide an efficient device as a generator or amplifier of frequency stable microwaves.

It is a further object of the present invention to provide a frequency stable microwave generator using a magnetized REB excited transmission grating coupled to a resonator.

It is still a further object of the present invention to achieve superior frequency stability by using the radiation at 90°.

To achieve the foregoing and other objects, and in accordance with the purposes of the present invention, as embodied and broadly described herein, the apparatus of this invention may comprise a microwave generator for efficiently converting the energy of an intense relativistic electron beam (REB) into a high-power microwave emission using the Smith-Purcell effect which is related to Cerenkov radiation. Feedback for efficient beam bunching and high gain is obtained by placing a cylindrical Smith-Purcell transmission grating on the axis of a toroidal resonator. High efficiency results from the use of a thin cold annular highly-magnetized REB that is closely coupled to the resonant structure.

An advatage of the present invention is the great degree of frequency stability that can be achieved. No known conventional non-relativistic beam microwave device can achieve the frequency stability to voltage fluctuations of the present invention because in non-relativistic beams the beam velocity, and hence the frequency, is strongly dependent on the accelerating voltage. In contrast, the use of an REB in the present invention decouples the beam velocity from the accelerating voltage. Indeed, many conventional devices are tuned by varying the accelerating voltage.

Another advantage of the present invention is the monochromatic operation that can be achieved. Prior art high-power microwave generators based on intense REBs are configured to extract the electromagnetic energy in the axial, or near axial, direction and thus have a strong frequency dependence on beam energy. For monochromatic operation these devices require special "flat-topped" voltage pulses. In the present invention, frequency is virtually independent of the REB energy, and, as a consequence, the present invention is superior to prior art as a monochromatic REB driven microwave generator using simple, inexpensive pulse-power technology.

BRIEF DESCRIPTION OF THE DRAWINGS

The accompanying drawings, which are incorporated in and form a part of the specification, illustrate one embodiment of the present invention and, together with the description, serve to explain the principles of the invention. In the drawings:

FIGS. 7a and 7b illustrate the time dependence of the frequency output of the subject invention for an accelerator producing a 3 MeV, 50 kA beam with a 85 ns pulse-width (FWHM) in a magnetically insulated foilless diode having the idealized voltage waveform shown in FIG. 7a;

DETAILED DESCRIPTION OF THE PREFERRED EMBODIMENT OF THE INVENTION

The microwave generator of the present invention efficiently converts the energy of the intense relativistic electron beam (REB) into high-power microwave emission using the Smith-Purcell effect, which is related to Cerenkov radiation. Feedback for efficient beam bunching and high gain is obtained by placing a cylindrical Smith-Purcell transmission grating on the axis of a toroidal quasi-optical resonator. High efficiency results from the use of a thin cold, annular high-magnetized REB that can be closely coupled to the resonant structure. The present invention, hereinafter called a CERETRON generator has superior frequency stability to changes in electron-beam accelerating voltage when compared with other electron-beam microwave generators and provides a desired monochromatic microwave output.

Figure 1:
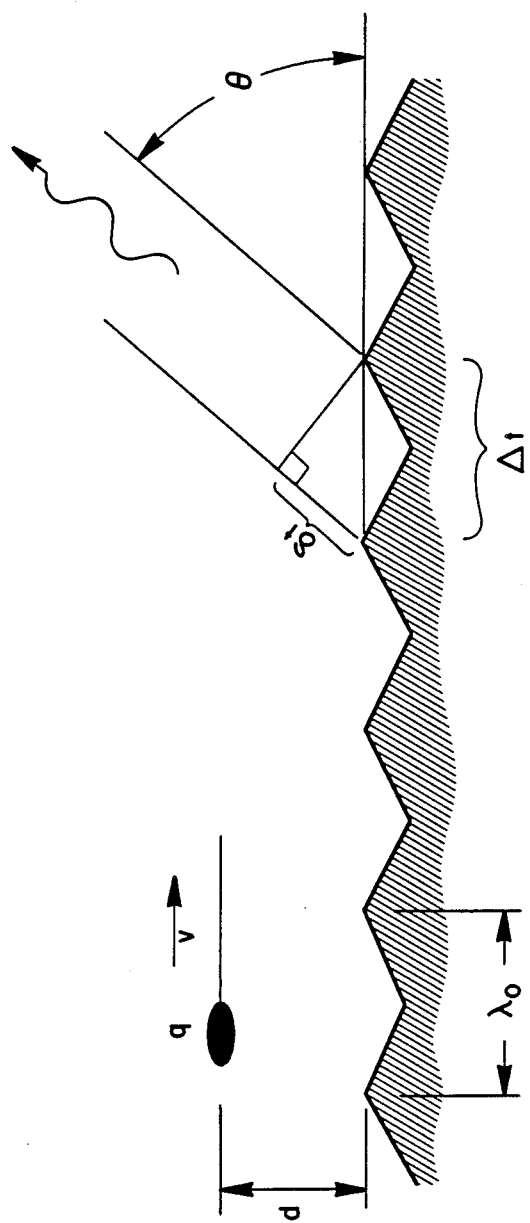
FIG. 1 illustrates Smith-Purcell radiation from a reflection grating.

Radiation is produced by the Smith-Purcell effect when a charged particle (or charge bunch) q passes close (at distance d) to a periodic conducting grating, parallel to the grating surface, but perpendicular to the rulings as shown in FIG. 1. An image charge is induced on the grating surface that produces a periodic force on the moving charge as the separation between it and the surface varies. The result is an oscillating electric dipole moving with velocity $\vec{\beta} = \vec{V}/c$. Electromagnetic waves are radiated in phase in the direction $\theta$ if the time delay between wavelets excited at successive ruling is an integral number of periods. As shown in the Huygens construction in FIG. 1, the propagation time is $$\delta t = \frac{\lambda_o \cos \theta}{c/n}, \qquad (1)$$

where n is the refractive index of the medium above the grating. The transit time for the charge bunch between rulings is $$\Delta t = \lambda_o / v. \qquad (2)$$

Thus, the phase matching condition that these differ by an integral number of periods is $$\Delta t - \delta t = N/f. \qquad (3)$$

For the case N=0, this gives the familiar expression for Cerenkov radiation, $\cos \theta = 1/n\beta$. The Smith-Purcell effect is described by the case N=1, which results in an expression for the radiated wavelength, $$\lambda = \lambda_o \left( \frac{1}{n\beta} - \cos\theta \right), \qquad (4)$$

where the wavelength and frequency of the radiation are related by $f\lambda = c/n$.

Figure 2:
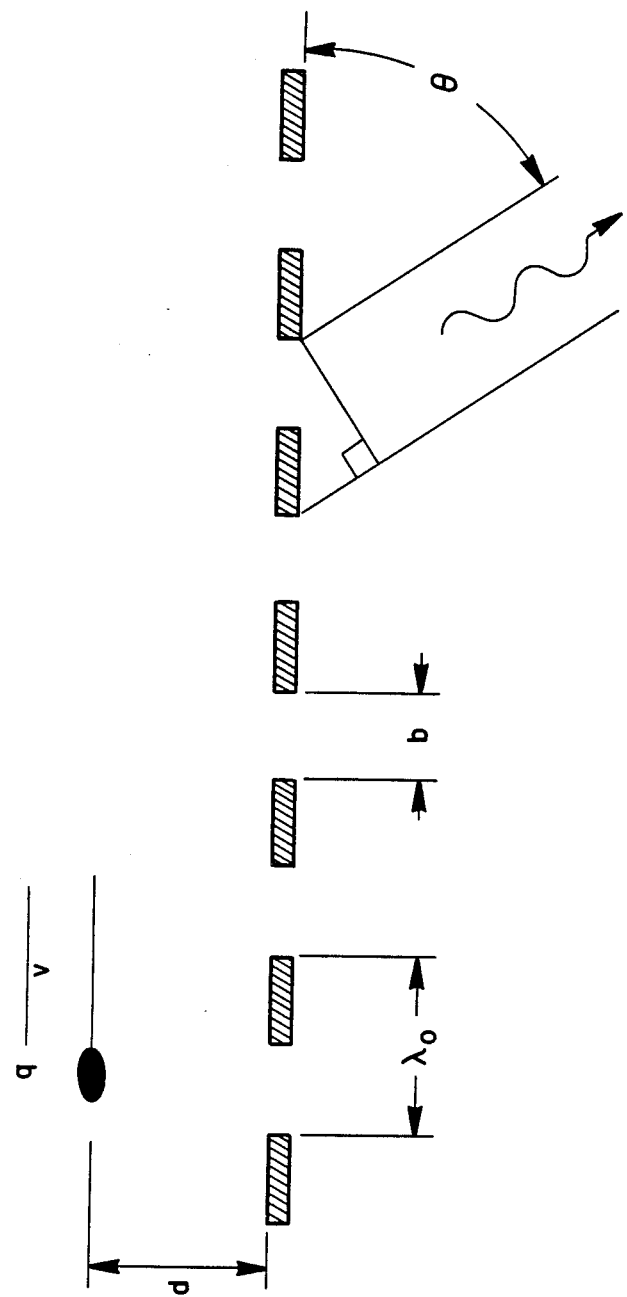
FIG. 2 illustrates Smith-Purcell radiation through a transmission grating.

The same principles can be applied to a charge bunch q passing over the transmission grating consisting of alternating conducting and transparent strips at a distance d as shown in FIG. 2. Equations 1 through 4 apply equally well to the transmission geometry with the angle $\theta$ referring to the transmission angle shown in FIG. 2.

Figure 3:
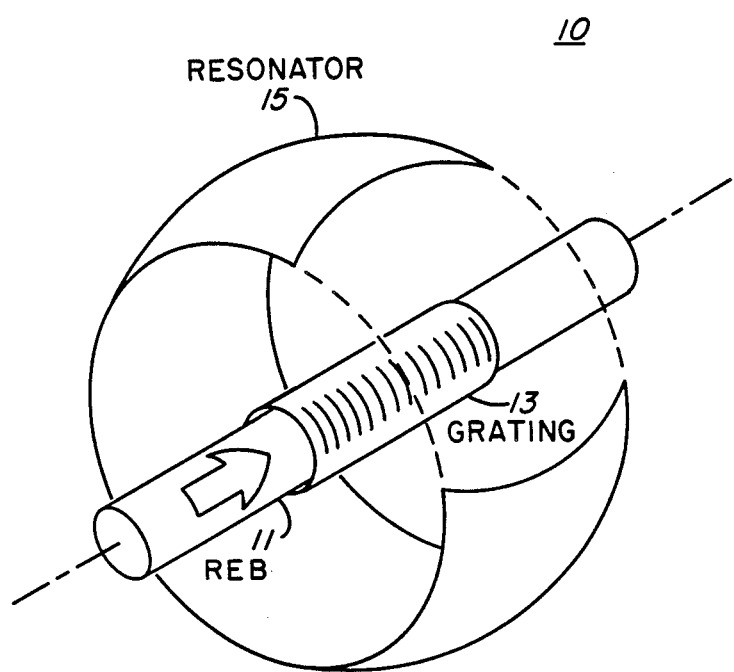
FIG. 3 illustrates an embodiment of the present invention for a high-power microwave generator based on Smith-Purcell radiation from a transmission grating situated in an open, quasi-optical resonator.
Figure 4:
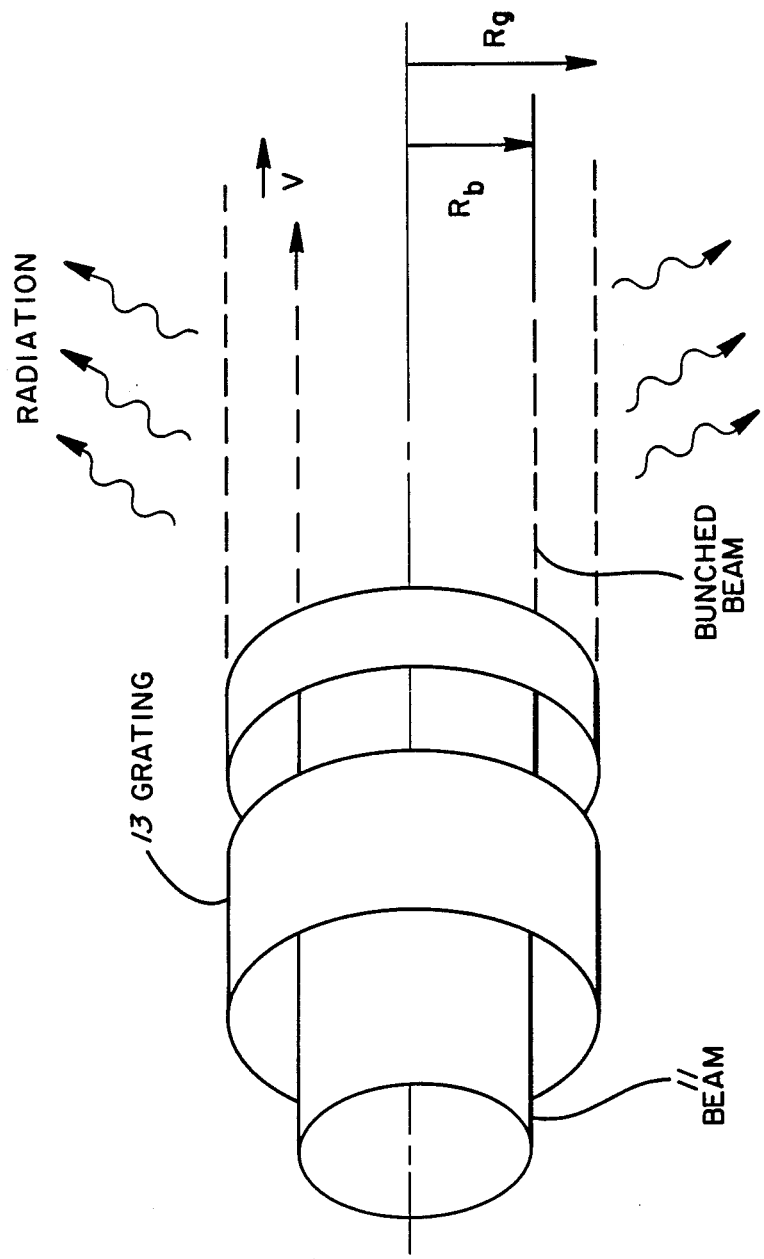
FIG. 4 shows a transmission grating in the form of an azimuthally-slotted cylinder for use in the present invention.

In the CERETRON generator 10 the transmission grating 13 is an azimuthally-slotted cylinder, as shown in FIG. 3. The charge bunches q are density modulations on a thin, annular, magnetized REB 11 that passes inside of the cylindrical grating 13. The beam bunching results from interaction of the beam with electric fields reinforced by waves reflected back into the grating from an external quasi-optical resonator 15. The modulation grows as each "bunch" passes successive slots in the grating 13, and has a chance to further interact with the wave fields (see FIG. 4). The dominant modes of the resonator 15 are waves with a transmission angle, $\theta = 90°$. This geometry for the transmission angle of waves coupled to the resonator 15 was selected for the CERETRON generator 10 in order to achieve the least dependence of resonant frequency on beam energy and because it is ideally suited for a thin annular REB 11. From Equation 4 with $\theta = 90°$, one obtains the relation between the CERETRON generator 10 emission wavelength and the grating 13 wavelength, $$\lambda = \frac{\lambda_o}{n\beta}. \qquad (5)$$

Figure 5:
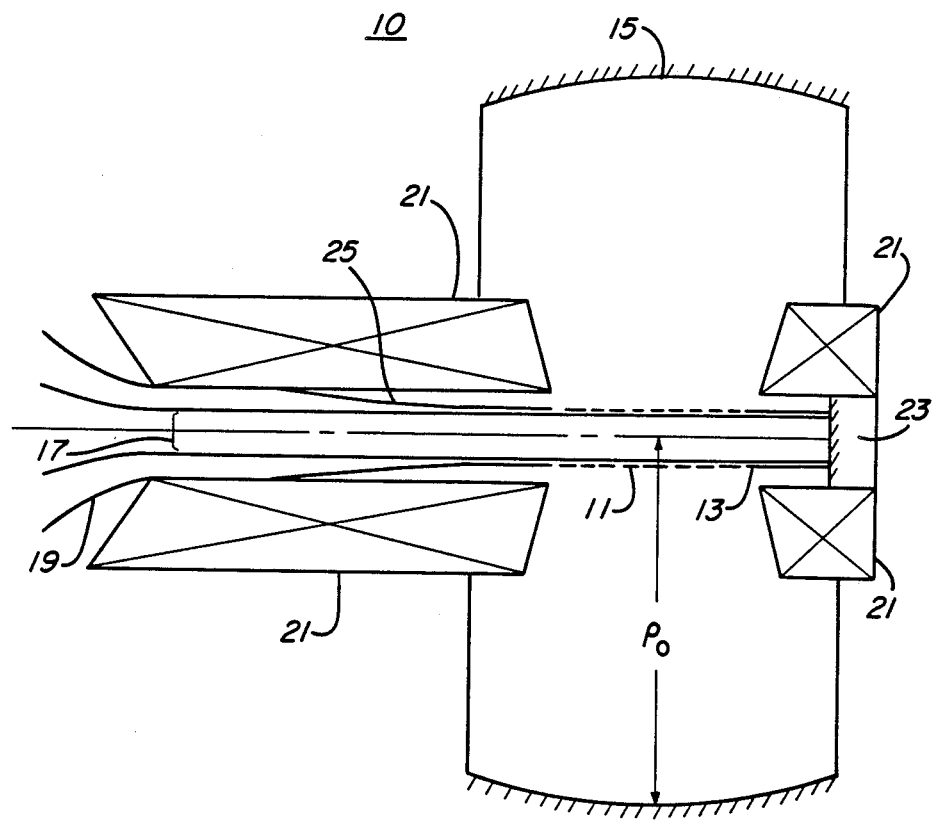
FIG. 5 diagrams a basic microwave generator fashioned as an oscillator in accord with the present invention.
Figure 6:
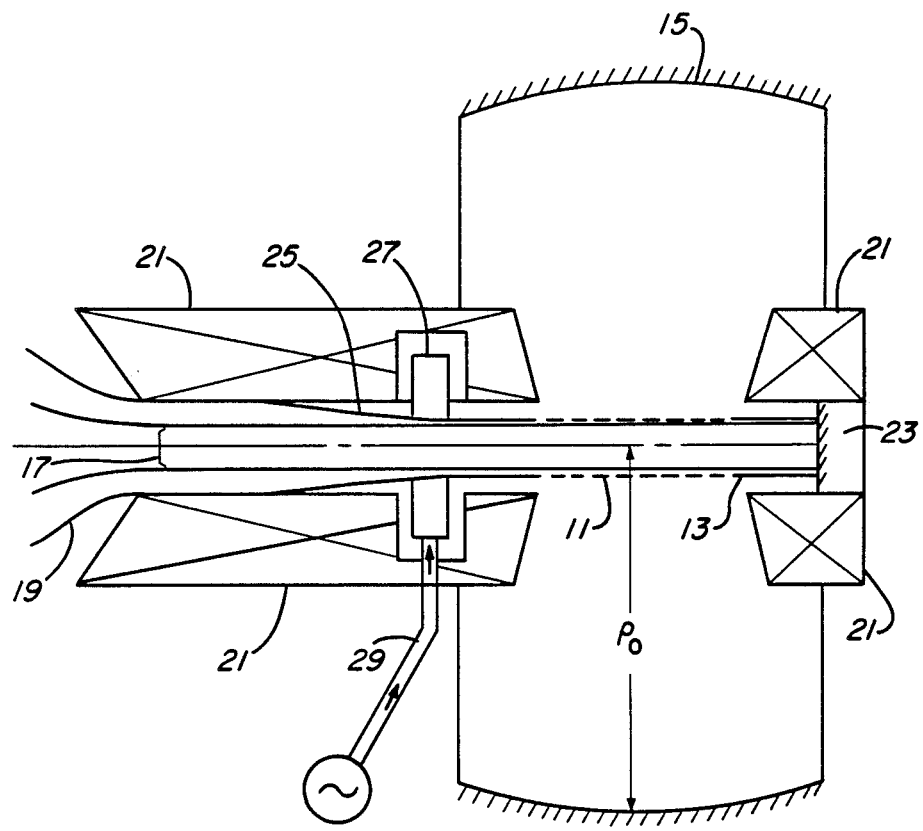
FIG. 6 diagrams a microwave generator fashioned as an amplifier in accord with the present invention.

In its simplest form, the CERETRON generator 10 is an oscillator including the REB 11, grating 13, resonator 15 and a magnetically-insulated diode cathode 17, a magnetically-insulated diode anode 19, axial magnetic-field coils 21, a beam dump 23 and a convergent guide 25, see FIG. 5. However, by including a beam premodulation cavity 27 and signal injector 29 CERETRON generator 10 can be operated as an amplifier (FIG. 6). In the amplifier mode, signals at the resonant frequency introduced into the premodulator 27 produce highly amplified signals in the output resonator 15.

Figure 7A:
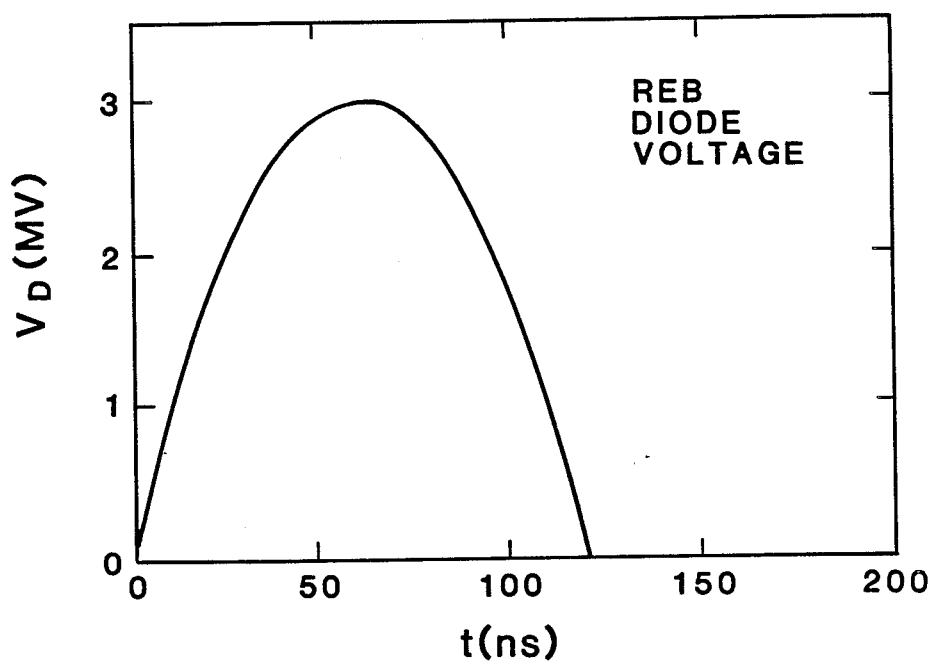
Figure 7B:
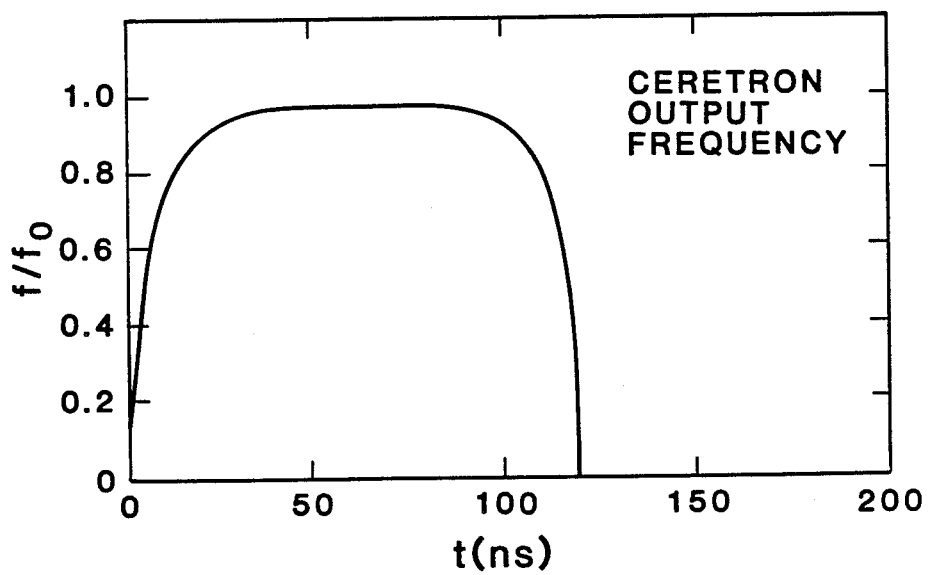

As previously noted, one of the outstanding features of the CERETRON generator 10 is the low sensitivity of the output wavelength to variations in beam energy resulting from variations in the accelerating voltage or from the conversion of beam energy into radiation. This can be clearly seen by differentiation of Equation 5;

$$\frac{d\lambda}{\lambda} = \frac{d\beta}{\beta} = -\frac{1}{\gamma^2 - 1} \frac{d\gamma}{\gamma}, \qquad (6)$$

where $Y = m_e c^2$ is the total (rest plus kinetic) energy of a beam electron. For example, a CERETRON generator 10 using a 4.5 MeV beam ($Y \sim 10$) would have only $\sim 0.1\%$ variation in wavelength from a 10% variation in beam energy. This feature makes the CERETRON generator 10 an ideal device for the production of monochromatic microwave radiation using simple pulse-power technology to generate a high-power REB 11 that, however, does not have well-regulated, constant accelerating voltage during most of the pulse. A specific example is provided by an REB accelerator having a 3 MeV, 50 kA beam with a 85 ns pulse-width (FWHM) in a magnetically insulated foilless diode. An idealized voltage waveform and CERETRON generator 10 microwave output frequency (from Equation 5) for this accelerator are shown in FIGS. 7a and 7b. (As will be discussed later, the beam energy was corrected for space-charge depression in a cylindrical grating with $R_g/R_b = 1.2$). It is clear that the radiation is nearly monochromatic over most of the pulse even in the abense of a flat-topped voltage pulse.

Other types of REB microwave generator (e.g. free-electron laser, Cerenkov maser, ubitron, etc.) are configured so that they radiate in the axial, $\theta=0°$, direction. For high-energy beams with $\gamma^2 >> 1$, the wavelength scales as $\lambda \alpha \lambda_o / Y^2$ for radiation in the axial direction, which makes these devices extremely sensitive to changes in beam accelerating potential.

The CERETRON generator 10 frequency stability is clearly superior. As a specific reference point for comparison, consider the Smith-Purcell radiation at $\theta=0°$. Equation 4 gives the wavelength scaling $$\lambda = \lambda_o \left( \frac{1}{n\beta} - 1 \right). \tag{7}$$

Figure 8:
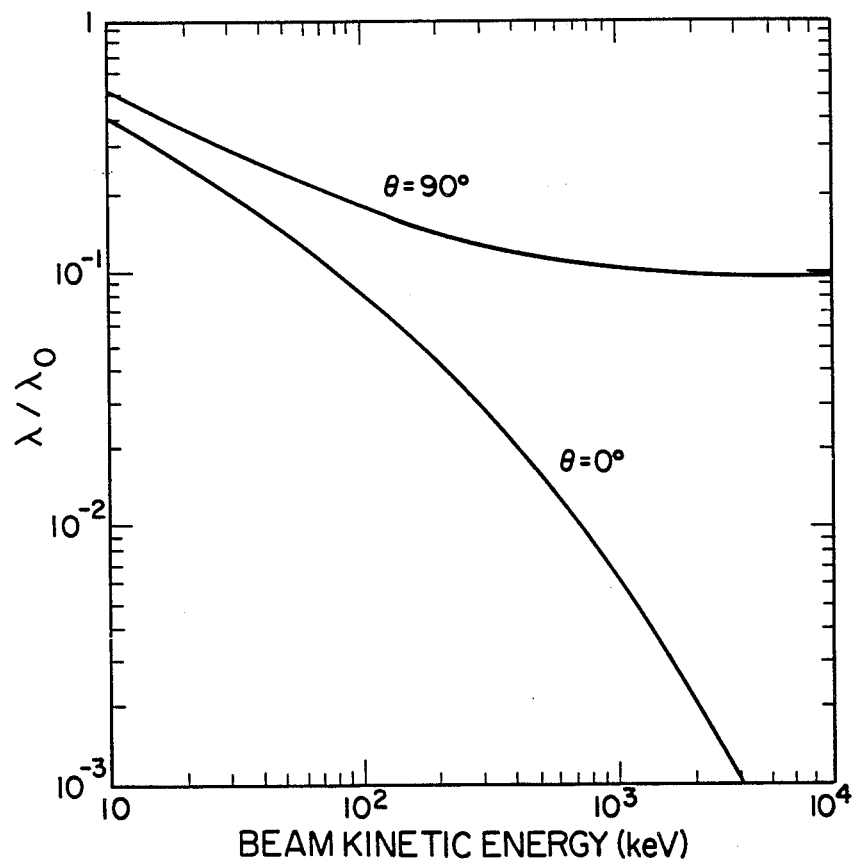
FIG. 8 illustrates wavelength dependence for $\theta=0°$ and for $\theta=90°$ of the present invention.

This wavelength dependence on beam energy is compared with the $\theta=90°$ CERETRON generator 10 dependence in FIG. 8. It is clear that, while the CERETRON generator wavelength depends very little on beam energy above ~1 MeV, the wavelength of the axial radiation is highly sensitive to variations in energy. In the earlier example of a 10% variation in the energy of a 4.5 MeV beam, the frequency of a tube having an axially directed output would vary by ~20% compared with the <<1% variation of the CERETRON generator frequency.

The power radiated through a transmission grating 13 by the Smith-Purcell effect has been calculated by Di Francia, and also by Bolotovskii and Burtsev. Their results are used here to make simple estimates of the CERETRON generator 10 efficiency and microwave emission power. Di Francia gives the apparent surface brightness as $$B = \frac{1}{4\pi\epsilon_0} \frac{2\pi v q^2 \delta^2}{D\lambda_o^2} \frac{\beta^3 \sin\theta}{(1-\beta\cos\theta)^3} \times \tag{8}$$

$$\exp\left[-4\pi \frac{d}{\lambda_o} \frac{(1-\beta^2)^{\frac{1}{2}}}{(1-\beta\cos\theta)}\right] \quad (W/m^2/Sr),$$

where $v$ is the rate of passage of bunches with charge q past the grating 13, which has a transverse dimension D. The distance of the bunch from the grating 13 surface is d. For the cylindrical transmission grating 13 geometry used in the CERETRON generator 10, $D=2\pi R_g$, and $d=R_g-R_b$, where $R_g$ and $R_b$ are the grating and beam radii. The intensity transmission factor $\delta$ depends on the structure of the grating, and is given by Bolotovskii and Burtsev to be $$\delta = \sin\left(\frac{\pi b}{\lambda_o}\right), \tag{9}$$

where b is the dimension of the transparent slot (see FIG. 2). In what follows $\delta$ is assumed to be unity. For a density modulated beam the current is given by $$I = I_0[1 + \alpha \cos(\omega_o t = k_o z)](A), \tag{10}$$

where $\omega_o/k_o=\beta c$. The charge in each "bunch" can be approximated by $q \sim \alpha I_o \lambda_o / \beta c$, and the rate by $v \sim \beta c/\lambda_o$. Using these approximations and $\theta=90°$ gives an estimate for the CERETRON generator 10 apparent surface brightness. This is multiplied by the CERETRON generator 10 emitting surface area ($A=2\pi R \times Z$), and also by $4\pi$ steradians to get the total power radiated from the Smith-Purcell tube:

$$P = 60(2\pi \propto I_o)^2 \frac{z}{\lambda_o}\left(1 - \frac{1}{\gamma^2}\right) \exp\left[-4\pi \frac{d}{\gamma\lambda_o}\right] \quad (W). \tag{11}$$

Figure 9:
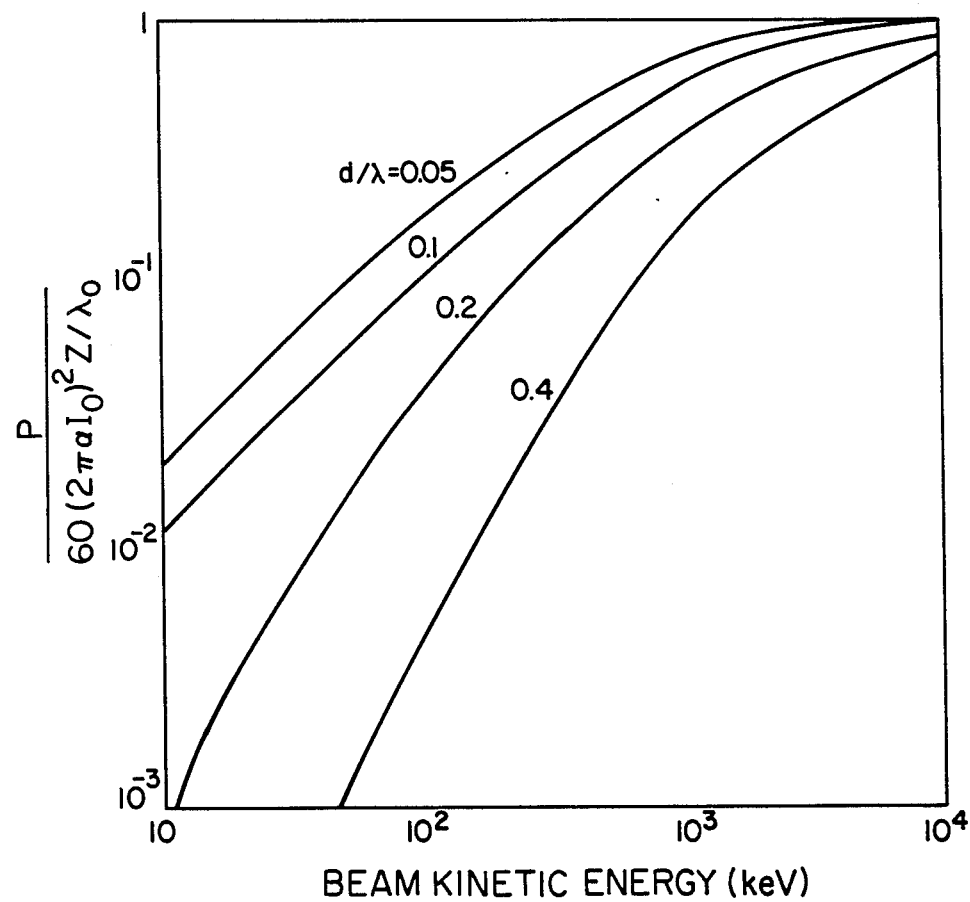
FIG. 9 diagrams the radiated microwave power on beam energy of the present invention.

The appearance of the exponential evanescence factor in these formulae shows the importance of passing the bunched beam close to the grating 13 surface and using a high-energy ($Y >> 1$) beam for efficient operation. The radiated power, normalized to the maximum, is shown in FIG. 9 for several values of $d/\lambda_o$.

The close coupling of the beam to the grating is accomplished in the CERETRON generator by using a thin annular REB produced by a 90 kG magnetically insulated diode. For a thin annular beam, the space-charge limited current from a diode with anode and cathode radii $R_a$ and $R_c$, respectively, is given by $$I = 17 \frac{(\gamma^{\frac{2}{3}} - 1)^{3/2}}{2 \ln (R_a/R_c)} \quad (kA), \tag{12}$$

for a thin beam with $Y < Y_{cr} \equiv [1 + 4\ln(R_a/R_c)]^{3/2}$. For Y greater than $Y_{cr}$, the space-charge limited current is $$I = 34 \left[ \frac{\gamma^2}{[1 + 4\ln(R_a/R_c)]^2} \right] - 1^{\frac{1}{2}}(kA) \tag{13}$$

The beam accelerating voltage at the diode is $$V = 511(Y-1)(keV), \tag{14}$$

which can be used with the space-charge limited current to get the diode power, $P_D = IV$. One can now define a CERETRON generator 10 efficiency by dividing the radiated power, Equation 11, by the diode power. When this is evaluated, one must use the space-charge depressed beam energy in the cylindrical grating 13 section of the CERETRON generator 10 in the expression for the radiated power. This is given by $Y_{sc} = Y^{\frac{1}{2}}$ for $$Y < Y_{cr} = [1 + 4ln(R_g/R_b)]^{3/2},$$

and $$Y_{sc} = Y/[1 + 4ln(R_g/R_b)] \text{ for } Y > Y_{cr}.$$

Figure 10:
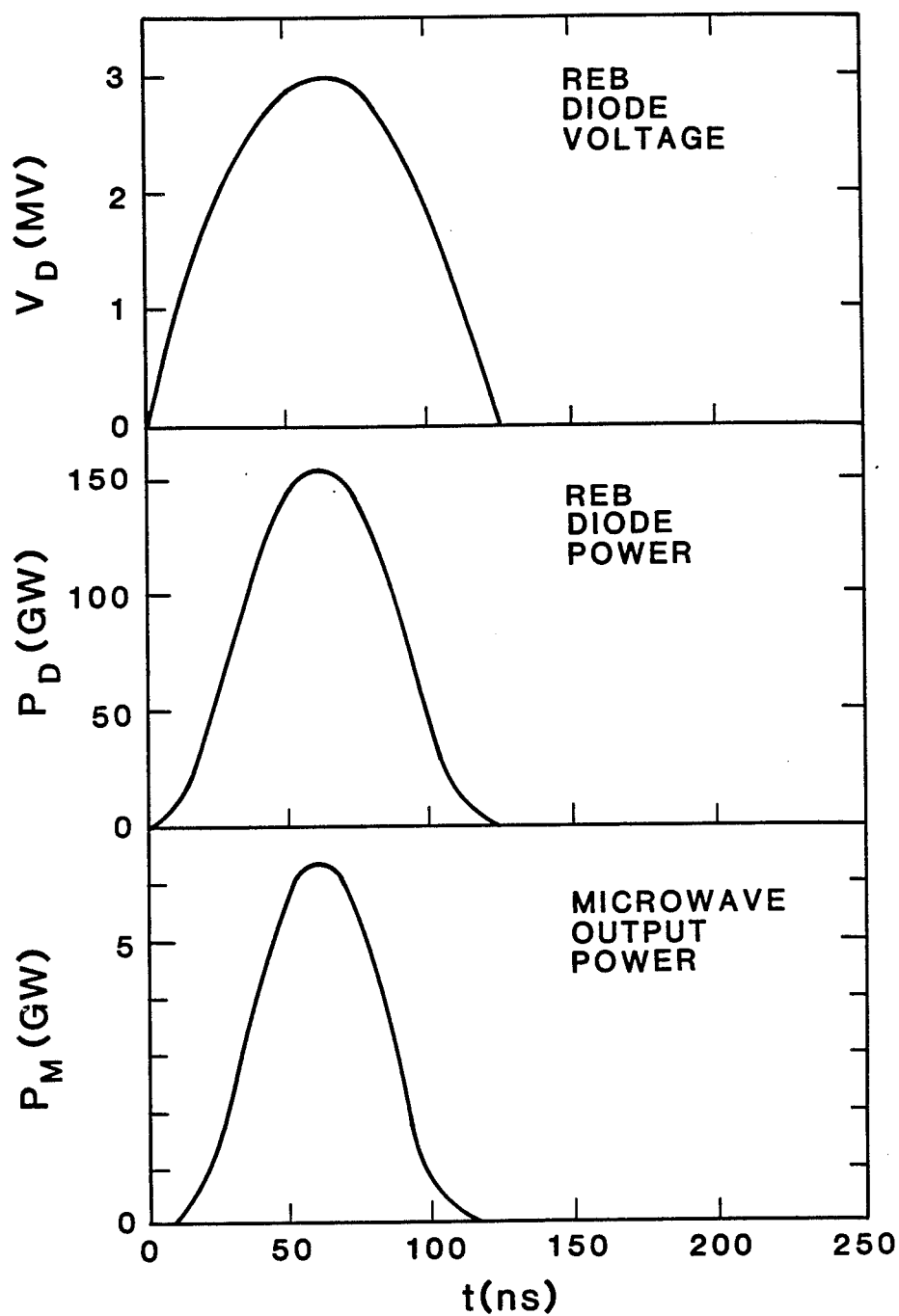
FIG. 10 illustrates the output power dependence upon REB diode voltage and power in the present invention.

As an example of what can be achieved with available pulse-power REB generators, the diode voltage, diode power, and expected microwave power are plotted in FIG. 10 for a REB driven CERETRON generator 10. For these estimates it was assumed that the 1 cm radius beam, produced in a diode with $R_a=2$ cm, could be brought within 2 mm of the grating through the use of a converging wall section of the guide tube. The assumed grating wavelength was $\lambda_o=1$ cm, and the grating axial extent was taken to be 20 wavelengths. The convergent section increases the efficiency by increasing the beam energy (i.e., by reducing the space-charge depression), and by more tightly coupling to the evanescent electric field, thereby reducing the exponential factor. It was also assumed that a beam modulation of $\alpha \sim 1\%$ could be achieved through feedback from an external resonator.

The dependence of the efficiency on the square of the modulation index $\alpha$ emphasizes the necessity for coupling the CERETRON generator 10 output to a resonator in order to enhance the modulation through feedback. The CERETRON generator 10 uses a toroidal quasi-optical resonator 15. The field in a toroidal, "whispering-gallery" type of resonator can be described by a set of radially propagating modes that have much in common with the axial modes in an open resonator with spherical mirrors, or in a Fabry-Perot etalon. Waves converging on the axis from the mirrors and waves diverging from the axis are described in full generality by Hankel functions of the first and second kind. A useful parameter for describing these modes is the phase factor $$a_m(k\rho) = \pi^{-1}[J_m(k\rho) + N_m(k\rho)]^{-1}, \qquad (15)$$

where J and N are Bessel functions of the first and second kind, respectively, and m is the azimuthal mode number. The resonant wavelengths of the fundamental radial modes that have an axial electric field for coupling to the REB are given by $$\lambda_{l00} = 2\rho_o \left[ l - \frac{1}{8} + \frac{1}{8l\pi^2} \right]^{-1} \sim 2\rho_o/l. \qquad (16)$$

For the lowest order azimuthal modes, $a_m(k\rho_o) \sim k\rho_o/2$ in a resonator with dimensions much greater than a wavelength. The case that the curvature of the toroidal surface, R, is related to the ring radius, $\rho_o$, by $R = 4a_m(-k\rho_o)/k$ is analogous to the confocal case for two spherical mirrors. Indeed, for wavelengths short compared with R and $\rho_o$, this simplifies to $R = 2\rho_o$, which is the confocal condition.

The Q for toroidal resonators 15 has been calculated by Goubau and Schwering including diffraction and resistive losses. For copper surfaces, the calculated Q is greater than $10^5$ for resonators having an axial extent $Z_o > 2(\lambda\rho_o/\pi)^{\frac{1}{2}}$. This condition also gives good separation of adjacent modes. Furthermore, the cavity eigenfunctions in this limit can be approximated in terms of Gaussian-Hermite functions, which are more tractable than the more general Hankel functions. In particular, because these functions also describe the modes of spherical-mirror resonators, many of the standard formulae derived for laser resonators may be taken over and used for the toroidal quasi-optical resonator. For example, if one defines the quantity $$g \equiv 1 - 2\rho_o/R, \qquad (17)$$

then the waist size of the resonator mode structure, that is the axial extent at $\rho = 0$, is given by $$Z_w = \left[ \frac{\lambda\rho_o}{\pi} \right]^{\frac{1}{2}} \frac{(1+g)^{\frac{1}{4}}}{(1-g)^{\frac{1}{4}}}. \qquad (18)$$

The axial extent at the mirror is $$Z_m = \left[ \frac{2\lambda\rho_o}{\pi} \right]^{\frac{1}{2}} \frac{1}{(1-g^2)^{\frac{1}{4}}}. \qquad (19)$$

These formulae can be used to design a toroidal CERETRON generator 10 resonator that simultaneously has adequate mode separation, a waist size large enough to cover the axial extent of the transmission grating 13, and a mirror dimension large enough to cover the mode size and avoid diffraction losses there. With such a resonator 15 large values of the beam modulation, $\alpha$, can be expected. Therefore, high efficiencies for conversion of REB energy into microwave energy will be achievable from CERETRON generator 10 oscillators and amplifiers employing toroidal quasi-optical resonators 15 in their design.

Tests have been conducted on a CERETRON generator 10 made in accord with the above teaching but without an external quasi-optical resonator. A b 2 cm diameter annular REB was produced in a smooth-bore magnetron geometry foilless diode immersed in a 90 kG magnetic field. The 2.8 MeV, 50 kA beam had a 85 ns pulse-width, and was 100 $\mu$m or less thick. The beam was very cold: its $\sim 30$ mr divergence gives it a brightness of over $10^{12}$ W/m$^2$/Sr. Two different stainless steel transmission gratings were used with the grating parameters for each listed in the following Table.

TABLE

| Grating No. | $R_g$ (cm) | $R_g$ (cm) | d (mm) | $\lambda_o$ (cm) | $\delta$ | $Z_g$ (cm) |
|---|---|---|---|---|---|---|
| 1 | 1.18 | 1.0 | 1.8 | 1.0 | 1 | 14.5 |
| 2 | 1.33 | 1.0 | 3.3 | 0.95 | 1 | 13.5 |

The grating was surrounded by a 7.6 cm diameter acrylic vacuum chamber with 3.3 mm thick walls. Microwave emission was physically limited by a Bitter-plate magnetic field coil, which had only a few small ($\sim 1$ cm$^2$) apertures for transmission of the 90° Smith-Purcell radiation.

Radiation was collected with a horn located just outside of the magnet, and was transmitted to a remote screen room through 10.7 meters of WR-28 waveguide. Microwave signals were detected in the screen room with a 1N53 crystal in a broadband mount. Highpass filters consisting of sections of smaller waveguides and the dispersion of the long WR-28 waveguide run allowed some crude frequency resolution of the detected signals. Two different horns were used during the tests. One of these collected all of the power transmitted through three apertures in the coil, and the other collected only the power transmitted through a single 1 cm$^2$ aperture. Measurements were made with the small horn located at several positions to determine if there was any axial variation in emission. None were detected.

The output power in these initial experiments was low: only $\sim 7$ kW peak power was detected in the 32–40 GHz range, possibly, due to a breakdown of the grating and vacuum vessel as a result of intense electric fields. If it is assumed that breakdown or other factors did not limit the output power, the measured microwave emission corresponds to a beam modulation $\alpha < 10^{-4}$. An external quasi-optical resonator would greatly increase efficiency.

The prior art references cited in this subject patent application are hereby incorporated by reference.

The foregoing description of one preferred embodiment of the invention has been presented for purposes of illustration and description. It is not intended to be exhaustive or to limit the invention to the precise form disclosed, and obviously many modifications and variations are possible in light of the above teaching.

The embodiments was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A microwave generator comprising:
   a relativistic electron beam;
   cylindrical grating means axially centered on said relativistic electron beam and closely coupled thereto, said cylindrical grating means for converting by the Smith-Purcell effect energy from said relativistic electron beam into microwave energy; and
   quasi-optical toroidal resonator means having said cylindrical grating means positioned on the axis thereof; said quasi-optical means for inducing beam bunching in said relativistic electron beam and for increasing energy conversion gain.

2. The invention of claim 1 wherein said relativistic electron beam is a thin cold, annular high-magnetized relativistic electron beam.

3. The invention of claim 1 wherein said cylindrical grating means includes an azimuthally-slotted cylinder.

4. The invention of claim 3 wherein said azimuthally-slotted cylinder is a stainless steel azimuthally-slotted cylinder.

5. The invention of claim 1 wherein said quasi-optical toroidal resonator means includes a whispering-gallery type toroidal resonator.

6. The invention of claim 5 wherein said whispering-gallery type toroidal resonator is made of copper.

* * * * *